US012588457B2

(12) United States Patent
Saito et al.

(10) Patent No.: US 12,588,457 B2
(45) Date of Patent: Mar. 24, 2026

(54) DIE BONDING APPARATUS AND MANUFACTURING METHOD FOR SEMICONDUCTOR DEVICE

(71) Applicant: Fasford Technology Co., Ltd., Minami-Alps (JP)

(72) Inventors: Akira Saito, Minami-Alps (JP); Takumi Sassa, Minami-Alps (JP); Yuki Nakui, Minami-Alps (JP)

(73) Assignee: Fasford Technology Co., Ltd., Minami-Alps City (JP)

( * ) Notice: Subject to any disclaimer, the term of this patent is extended or adjusted under 35 U.S.C. 154(b) by 465 days.

(21) Appl. No.: 17/573,324

(22) Filed: Jan. 11, 2022

(65) Prior Publication Data

US 2022/0238357 A1    Jul. 28, 2022

(30) Foreign Application Priority Data

Jan. 26, 2021    (JP) ................................. 2021-010711

(51) Int. Cl.
*H01L 21/67* (2006.01)
*B32B 37/00* (2006.01)
(Continued)

(52) U.S. Cl.
CPC .... *H01L 21/67132* (2013.01); *B32B 37/0046* (2013.01); *B32B 43/006* (2013.01);
(Continued)

(58) Field of Classification Search
CPC . H01L 29/42356; H01L 29/247; H01L 22/14; H01L 29/78696; H01L 29/1054;
(Continued)

(56) References Cited

U.S. PATENT DOCUMENTS

2003/0075271 A1* 4/2003 Yoshimoto ........ H01L 21/67132
156/716
2005/0059205 A1* 3/2005 Maki ................. H01L 21/67132
438/232
(Continued)

FOREIGN PATENT DOCUMENTS

JP        2005-117019 A    4/2005
JP        2013-65628 A     4/2013
(Continued)

OTHER PUBLICATIONS

JP2019047089A_machine translation (Year: 2019).*
(Continued)

*Primary Examiner* — Brian Turner
(74) *Attorney, Agent, or Firm* — Crowell & Moring LLP

(57) ABSTRACT

A die bonding apparatus includes a push-up unit, a head having a collet that sucks a die, and a control device. The control device is configured to suck a dicing tape using a dome plate; land the collet onto the die using the head; suck
(Continued)

the die using the collet; lift plural blocks from the dome plate; stop the outermost block disposed on the outermost side among the plural blocks from lifting at a height where the die is peeled off from the dicing tape; and lift blocks other than the outermost block among the plural blocks higher than the outermost block to a predefined height.

4 Claims, 15 Drawing Sheets

(51) Int. Cl.
*B32B 43/00* (2006.01)
*H01L 21/48* (2006.01)
*H01L 21/683* (2006.01)

(52) U.S. Cl.
CPC ...... *H01L 21/4853* (2013.01); *H01L 21/6836* (2013.01); *B32B 2457/14* (2013.01); *H01L 2221/68327* (2013.01); *H01L 2221/68386* (2013.01)

(58) Field of Classification Search
CPC ........... H01L 29/42384; H01L 29/7869; H01L 29/78693; H01L 29/78606
See application file for complete search history.

(56) References Cited

U.S. PATENT DOCUMENTS

| | | | | |
|---|---|---|---|---|
| 2011/0051124 A1* | 3/2011 | Wang | .................... | H01L 21/681 |
| | | | | 356/400 |
| 2013/0122615 A1* | 5/2013 | Kobashi | ........... | H01L 21/67132 |
| | | | | 438/16 |
| 2020/0312699 A1 | 10/2020 | Yokomori et al. | | |

FOREIGN PATENT DOCUMENTS

| | | | | | |
|---|---|---|---|---|---|
| JP | 2017-224640 A | | 12/2017 | | |
| JP | 2019-29650 A | | 2/2019 | | |
| JP | 2019047089 A | * | 3/2019 | | |
| JP | 2020047871 A | * | 3/2020 | ......... | H01L 21/6838 |
| JP | 2020-72125 A | | 5/2020 | | |
| JP | 2020-161534 A | | 10/2020 | | |

OTHER PUBLICATIONS

Adjacent definition (Merriam-Webster), https://www.merriam-webster.com/dictionary/adjacent (Year: 2024).*
Machine translation of JP 2020047871 A (Year: 2000).*
C1 English Translation of Japanese-language Office Action issued in Japanese Application No. 2021-010711 dated Jul. 23, 2024 (6 pages).

* cited by examiner

F I G . 2
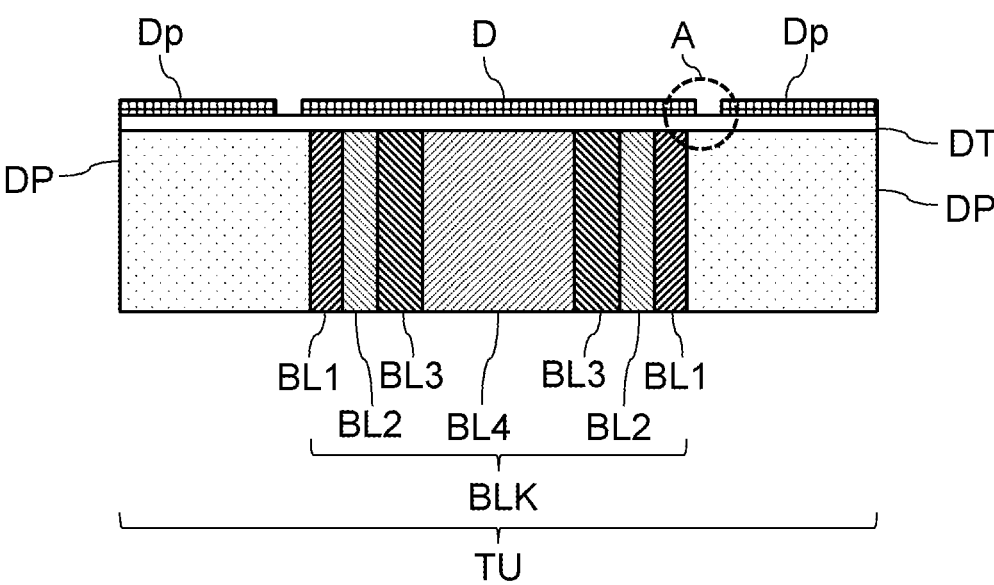
F I G . 3
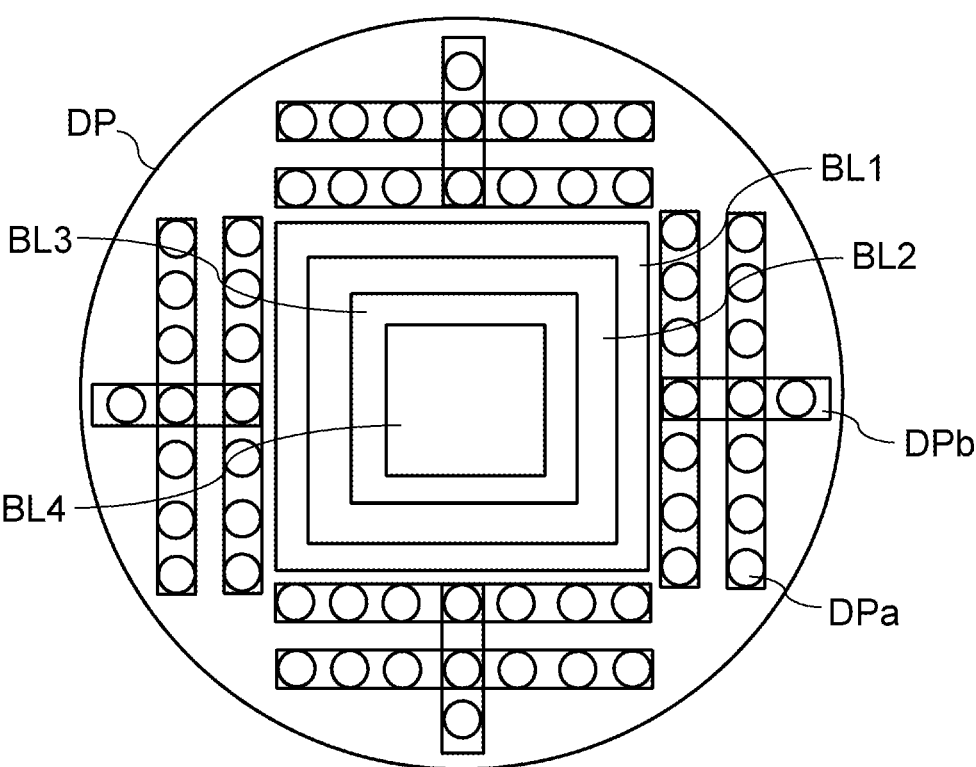

F I G . 4 A
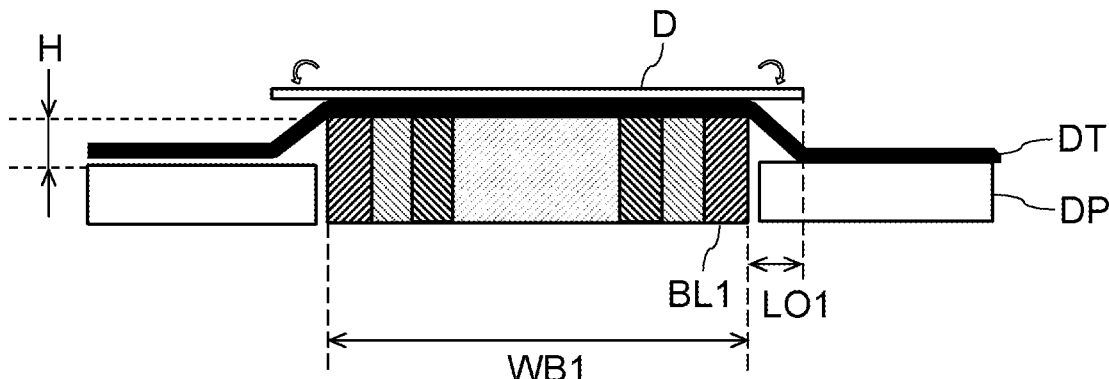
F I G . 4 B
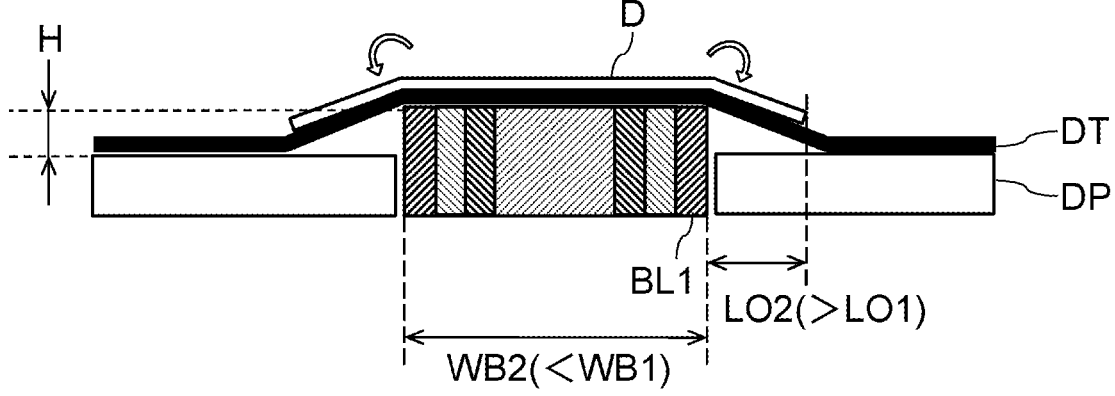

F I G . 6

F I G . 1 0 A
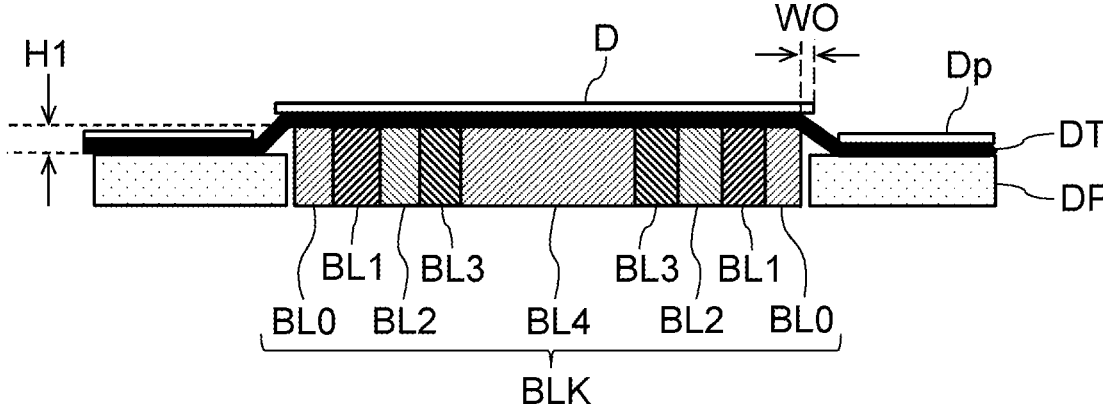
F I G . 1 0 B
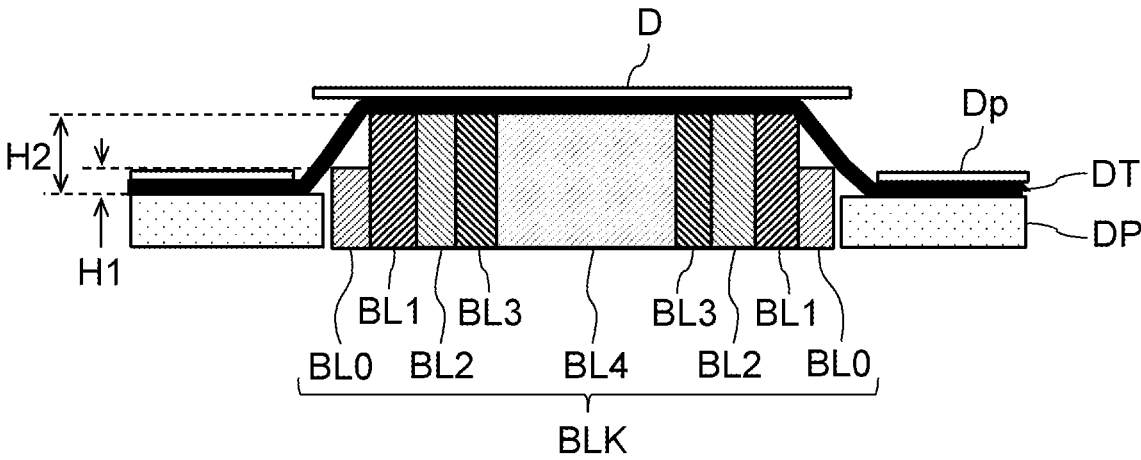

F I G . 1 1 A
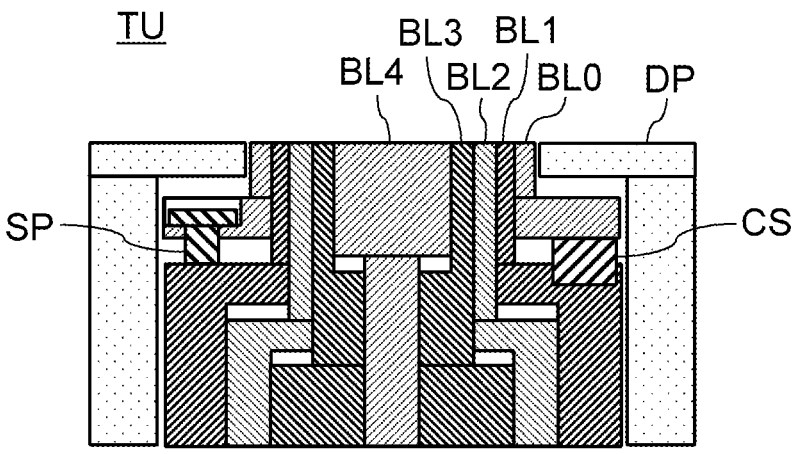
F I G . 1 1 B
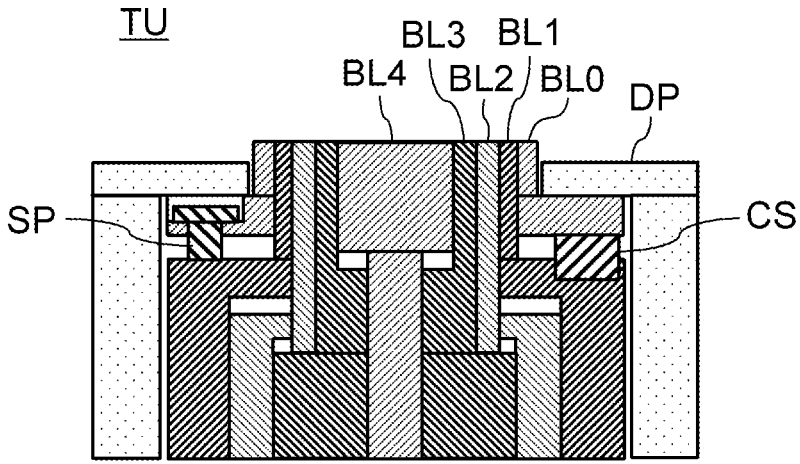

F I G . 1 3 A
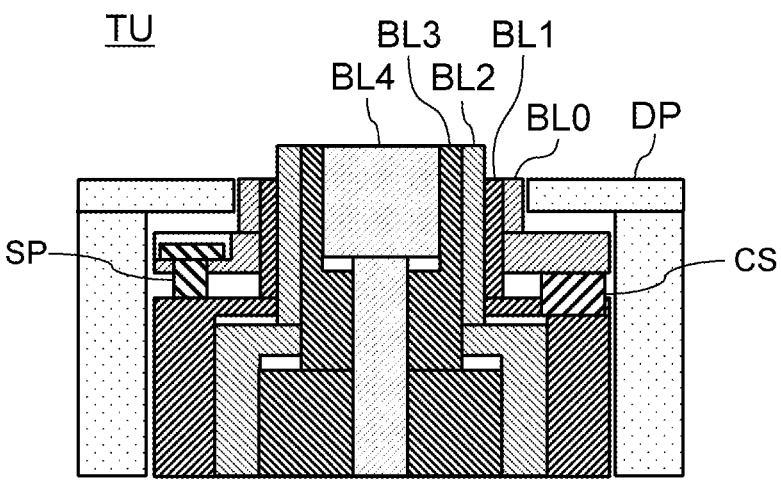
F I G . 1 3 B
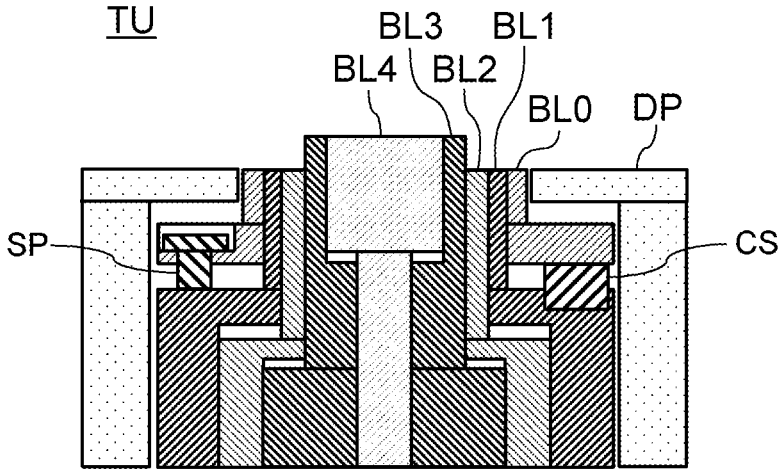

F I G . 1 8
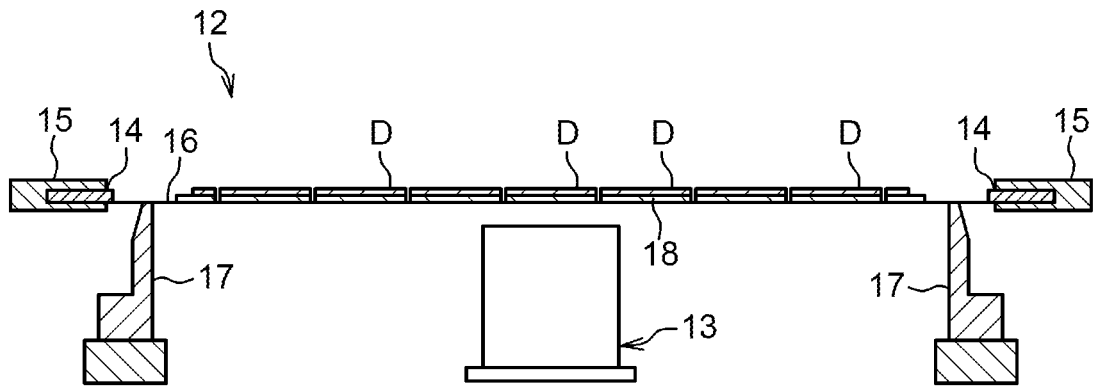
F I G . 1 9
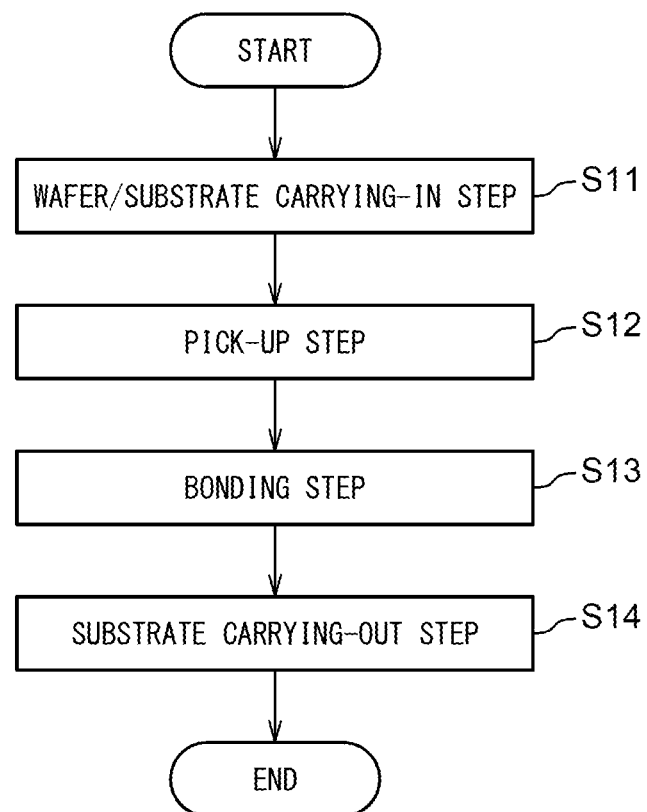

DIE BONDING APPARATUS AND MANUFACTURING METHOD FOR SEMICONDUCTOR DEVICE

CLAIM OF PRIORITY

The present application claims priority from Japanese patent application JP2021-10711 filed on Jan. 26, 2021, the content of which is hereby incorporated by reference into this application.

BACKGROUND

The present disclosure relates to die bonding apparatuses and, for example, the present disclosure can be applied to a die bonder with a push-up unit.

In a die bonder for mounting semiconductor chips, which are referred to as dice, onto, for example, the upper surface of a wiring board, a lead frame, or the like (hereinafter, generically referred to as a substrate), generally an operation (work) for bonding dice by transferring the dice onto a substrate using a suction nozzle such as a collet, giving a pressing force to the dice, and heating a jointing material is repeatedly performed.

There is a peeling-off step in which a die is peeled off from a semiconductor wafer (hereinafter, referred to as a wafer) in a die bonding step performed by a die bonding apparatus such as a die bonder. In the peeling-off step, dice are pushed up from under the lower surface of a dicing tape by a push-up unit, peeled off from the dicing tape held by a die feed section one by one, and transferred onto a substrate using a suction nozzle such as a collet.

SUMMARY

In recent years, the thickness of a wafer (a die) has become thinner in association with the advent of die-laminated packages and 3D-NANDs (three-dimensional NAND flashes). As a die becomes thinner, the rigidity of the die becomes extremely low in comparison with the adhesive force of a dicing tape. Therefore, for example, in the case where a die with its thickness less than several tens of micrometers is picked up, it is necessary to reduce a stress applied to the die (the reduction of stress is needed).

An object of the present disclosure is to provide a technology using which a stress applied to a die is more effectively reduced.

Other problems and new features will be explicitly shown by the descriptions of the present specification and the accompanying drawings.

The outline of a typical die bonding apparatus included in the present disclosure is briefly described as follows.

To put it concretely, the die bonding apparatus includes a push-up unit, a head having a collet that sucks a die, and a control device. The control device is configured to suck a dicing tape using a dome plate; land the collet onto the die using the head; suck the die using the collet; lift plural blocks from the dome plate; stop the outermost block disposed on the outermost side among the plural blocks from lifting at a height where the die is peeled off from the dicing tape; and lift blocks other than the outermost block among the plural blocks higher than the outermost block to a predefined height.

According to the present disclosure, it is possible to reduce a stress applied to a die.

BRIEF DESCRIPTION OF THE DRAWINGS

FIG. 2 is a cross-sectional view of the main part of a push-up unit shown in FIG. 1;

FIG. 3 is a top view of the push-up unit shown in FIG. 2;

FIG. 4A and FIG. 4B are diagrams used for explaining a problem that occurs at the time of blocks being pushed up;

FIG. 6 is a diagram used for explaining the push-up sequence of an RMS according to the embodiment;

FIG. 10A and FIG. 10B are diagrams used for explaining block push-up according to the first modification example;

FIG. 11A and FIG. 11B are diagrams used for explaining the configuration and operation of a push-up unit according to a second modification example;

FIG. 13A and FIG. 13B are other diagrams used for explaining the configuration and operation of the push-up unit according to the second modification example;

FIG. 18 is a schematic cross-sectional view of the main part of a die feed section shown in FIG. 16; and FIG. 19 is a flowchart used for explaining a manufacturing method for a semiconductor device using a die bonder shown in FIG. 16.

DESCRIPTION OF THE PREFERRED EMBODIMENTS

Hereinafter, an embodiment, modification examples, and a practical example will be explained with reference to the accompanying drawings. Hereafter, in the following descriptions, the same components are given the same reference signs, and repeated explanations about redundant parts will be omitted in some cases. Furthermore, there are some cases where, in order to make the descriptions easier to understand in the accompanying drawings, the widths, thicknesses, shapes, and the like of respective portions of the embodiment, the modification examples, and the practical example are schematically depicted differently from what they really are, but these depictions are only examples, so that the interpretation of the present disclosure is not limited to these depictions.

Embodiment

Figure 1:
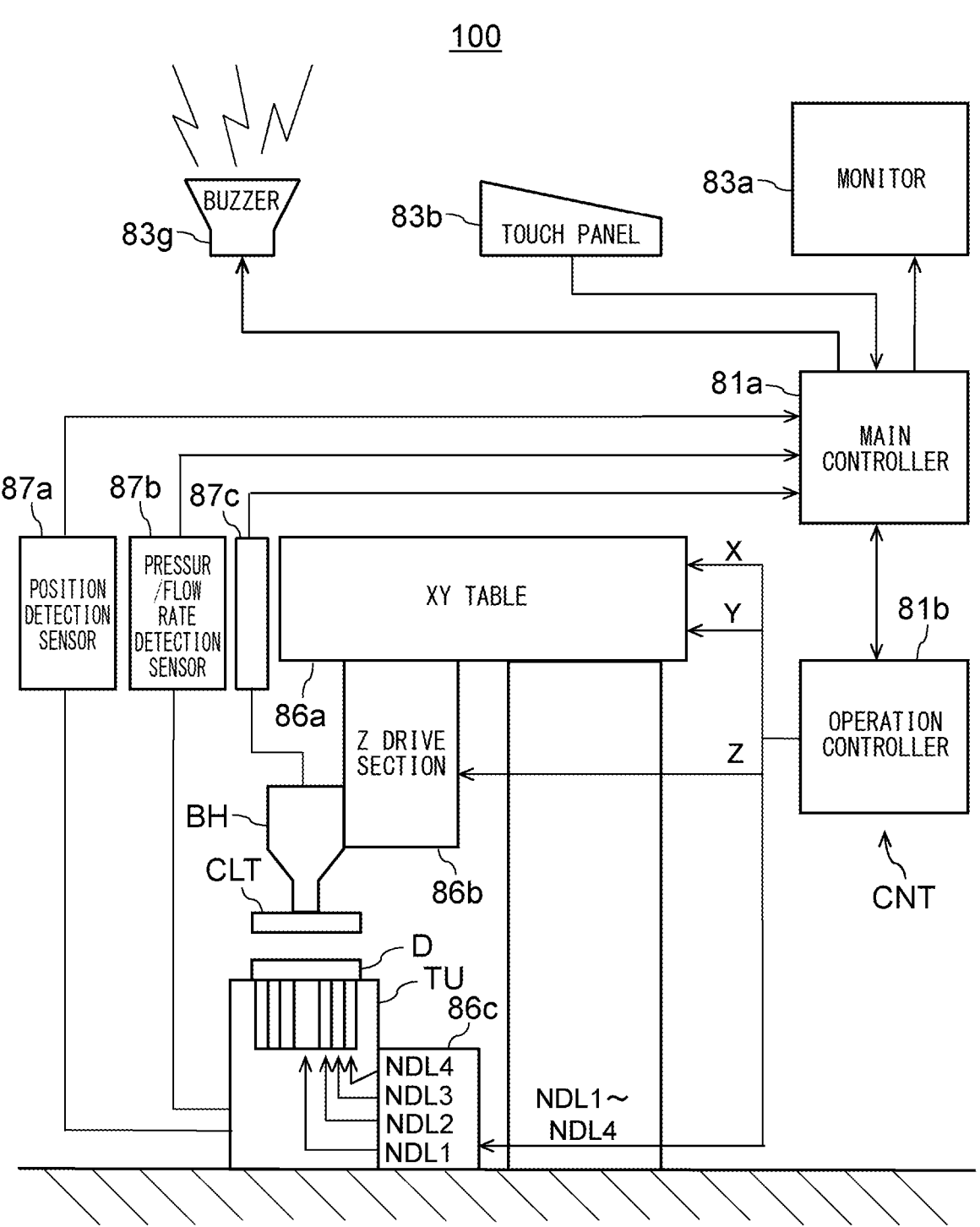
FIG. 1 is a schematic diagram showing the configuration of a die bonding apparatus according to an embodiment.

First, a die bonding apparatus according to an embodiment will be explained with reference to FIG. 1. FIG. 1 is a schematic diagram showing the configuration of the die bonding apparatus according to the embodiment.

A die bonding apparatus 100 includes a control section (control device) CNT having a main controller 81*a*, an operation controller 81*b*, a monitor 83*a*, a touch panel 83*b*, and a buzzer 83*g*. The die bonding apparatus 100 further includes an XY table 86*a*, a Z drive section 86*b*, and a push-up unit TU that are all controlled by the operation controller 81*b*. The die bonding apparatus 100 further includes a head (a bonding head or a pick-up head) BH that is moved up and down by the Z drive section 86*b* and a collet CLT fixed to the tip of the head BH. The die bonding apparatus 100 further includes a sensor 87*a* for detecting the position of the push-up unit TU, a sensor 87*b* for detecting a pressure and a flow rate, and a sensor 87*c* for detecting the gas flow rate of the collet CLT. The push-up unit TU has a function for sucking a dicing tape by vacuum suction and a function for blowing up air to the dicing tape.

Next, the push-up unit TU will be explained with reference to FIG. 2 and FIG. 3. FIG. 2 is a cross-sectional view of the main part of the push-up unit shown in FIG. 1, and shows the state of the push-up unit having contact with the dicing tape. FIG. 3 is the top view of the push-up unit shown in FIG. 2.

Plural suction holes DPa and plural grooves DPb that connect the plural suction holes DPa are provided in a dome plate DP disposed in the periphery of the upper surface of the push-up unit TU. The insides of the suction holes DPa are decompressed by an unshown suction mechanism when the upper surface of the push-up unit TU is made to come into contact with the lower surface of the dicing tape by lifting the push-up unit TU. At this time, the lower surface of the dicing tape DT is sucked downward and attached firmly to the upper surface of the dome plate DP.

Four blocks BL1 to BL4 for pushing up the dicing tape DT are embedded in the central part of the push-up unit TU. Three outer blocks BL1 to BL3 are in the shapes of square cylinders respectively and the innermost block BL4 is in the shape of a square column. As for the disposition of the four blocks BL1 to BL4, the second block BL2, the outer peripheral length of which is smaller than that of the first block BL1, is disposed inside of the first block BL1 the outer peripheral length of which is the largest, the third block BL3, the outer peripheral length of which is smaller than that of the second block BL2, is disposed inside of the second block BL2, and the fourth block BL4, the outer peripheral length of which is the smallest, is disposed inside of the third block BL3.

Among the four blocks BL1 to BL4, the outermost block BL1 the outer peripheral length of which is the largest is one size smaller than a die D that is a target die to be peeled off. Therefore, since the corner portions of the outer periphery of the upper surface of the block BL1 are located slightly inner than the outer edge of the die D, a force used for peeling off the die D from the dicing tape DT can be concentrated on a position that is a starting point from which peeling off the die D from the dicing tape DT begins (the outermost portion of the periphery of the die D). Here, as shown in a dashed line circle A in FIG. 2, a portion of the outer periphery of the die that protrudes outside of the edge of the outermost block BL1 is called an overhang (OH). It is preferable that the length of the overhang is about equal to or larger than the thickness of the dicing tape DT.

The thickness of the dicing tape DT is, for example, about 0.1 mm. The length of the overhang is, for example, 0.1 mm to 0.5 mm, more preferably, 0.15 mm to 0.45 mm. The block width of a position where the block BL1 and the dicing tape DT have contact with each other is, for example, about 0.3 mm to 0.6 mm, the block width of the block BL2 is, for example, about 0.6 mm to 1.2 mm, and the block width of the block BL3 is, for example, about 0.8 mm to 1.2 mm.

The heights of the upper surfaces of the four blocks BL1 to BL4 are equal to one another at their initial states (at the time of the blocks BL1 to BL4 being not in operation), and the heights of the upper surfaces are equal to or lower than the height of the upper surface of the dome plate DP.

As shown in FIG. 1, the four blocks BL1 to BL4 can be moved up and down independently by needles NDL4 to NDL1 that are the four drive axes of a drive section 86*c*. The drive section 86*c* includes an unshown motor and a plunger mechanism that converts the rotations of the motor into up-and-down motions using a cam or a link, and gives the up-and-down motions to the needles NDL4 to NDL1.

For example, the push-up unit TU can perform an operation in which the four blocks BL1 to BL4 are pushed up at the same time, subsequently the inner blocks BL2 to BL4 are further pushed up at the same time, subsequently the blocks BL3 and BL4 are further pushed up at the same time, and subsequently the block BL4 is further pushed up, with the result that the four blocks BL1 to BL4 are disposed in a pyramid shape. In addition, the push-up unit TU can perform, for example, an operation in which, after the four blocks BL1 to BL4 are pushed up at the same time, the block BL1, the block BL2, and the block BL3 are sequentially lowered in this order. It will be assumed that the latter operation is referred to as an RMS (Reverse Multi Step) in the present disclosure.

Hereinafter, in order to clearly explain the present embodiment, a problem that occurs when a die is peeled off from a dicing tape will be explained with reference to FIG. 4A and FIG. 4B using the RMS as an example. FIG. 4A and FIG. 4B are diagrams used for explaining a problem that occurs at the time of the blocks being pushed up. FIG. 4A is a cross-sectional diagram showing a state where all the blocks are pushed up at the same time to the highest position in the case of the overhang being short. FIG. 4B is a cross-sectional diagram showing a state where all the blocks are pushed up at the same time to the highest position in the case of the overhang being long.

As shown in FIG. 4A, even if the push-up height (H) of the outermost block BL1 is low, the outer periphery of a die D (a target die to be peeled off) is peeled off with the small deformation of the die by making the length (LO1) of the overhang short. With this, a stress applied to the die D becomes small. However, adjacent dice Dp, that is to say, dice adjacent to the target die to be peeled off tend to be easily deformed.

If the push-up height (H) of the block BL1 shown in FIG. 4B is the same as the height (H) shown in FIG. 4A, the deformations of the adjacent dice Dp become small by making the length (LO2) of an overhang shown in FIG. 4B longer than the width (LO1) of the overhang shown in FIG. 4A. However, as shown in FIG. 4B, the outer periphery of the target die D to be peeled off is largely deformed. Therefore, the stress applied to the die D becomes larger. Here, if the size of the die D shown in FIG. 4A and the size of the die D shown in FIG. 4B are the same, the size (WB2) of the blocks shown in FIG. 4B becomes smaller than the size (WB1) of the blocks in FIG. 4A.

If a starting point for peeling off a target die D to be peeled off is to be made using the outermost block BL1, the abovementioned contradictory problem occurs. Therefore, it becomes necessary that not only the deformation of a target die D to be peeled off, but also the deformations of adjacent dice Dp should be reduced.

Figure 5A:
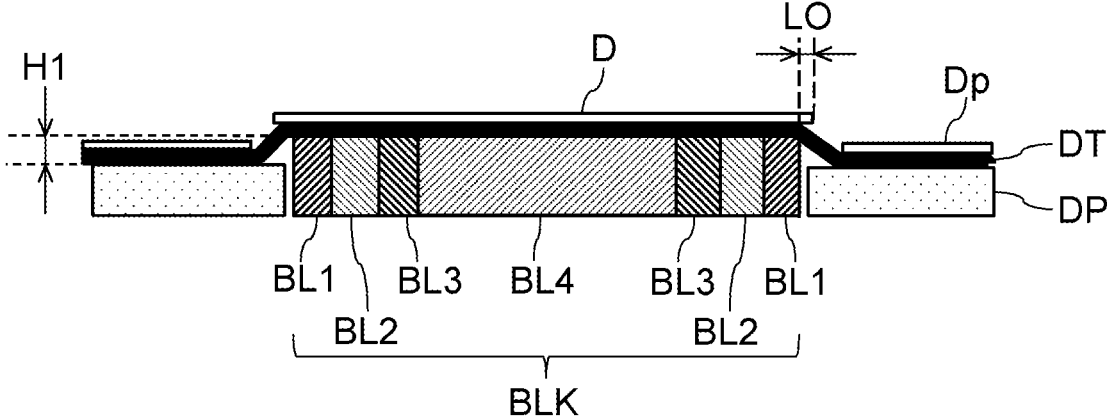
FIG. 5A and FIG. 5B are diagrams used for explaining block push-up according to an embodiment.
Figure 5B:
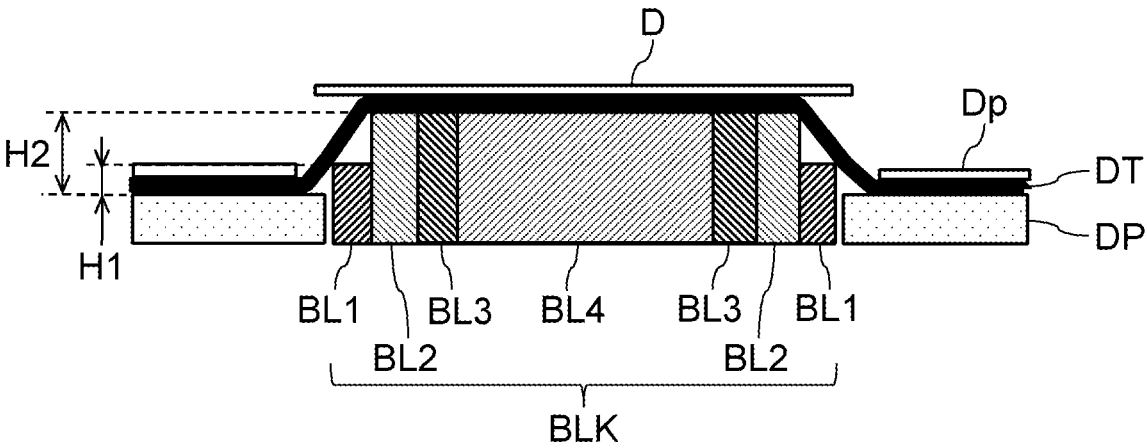

The outline of the present embodiment for solving the abovementioned problem will be explained with reference to FIG. 5A and FIG. 5B. FIG. 5A and FIG. 5B are diagrams used for explaining block push-up according to the embodiment, and FIG. 5A is a cross-sectional view showing a state where blocks are in the middle of being pushed up. FIG. 5B is a cross-sectional view showing a state where the push-up of the blocks is finished.

As shown in FIG. 5A, the total of the sizes of the blocks is made large, and an overhang is made short. Furthermore, when the four blocks BL1 to BL4 are pushed up, pushing up the outermost block BL1 is stopped at the time of the outer periphery of the die D being peeled off, and as shown in FIG. 5B, the inner blocks BL2 to BL4 are further pushed up, so that the deformations of the adjacent dice Dp are prevented from occurring. The length (LO) of the overhang is, for example, 0.1 mm to 0.5 mm as mentioned above. In addition, a height (H1) at which the outermost block BL1 is stopped from rising is, for example, 0.075 mm to 0.12 mm. A height (H2) to which the inner blocks BL2 to BL4 are pushed up is, for example, 0.15 mm to 0.2 mm.

Next, the setting method and control of the operation of the push-up unit TU will be explained with reference to FIG. 1.

The main controller 81a and the operation controller 81b are configured to control the NDL4 to NDL1 that drive the four blocks BL1 to BL4 respectively on the basis of a time chart recipe that sets the operations of the four blocks BL1 to BL4 in terms of a step time, the speed of lifting or lowering, and a height (position) for each block and for each step.

Plural time chart recipes respectively having different setting items are provided in advance, and a user selects one time chart recipe of the plural time chart recipes using a GUI (Graphical User Interface), and inputs setting values into the items of the selected time chart recipe. Alternatively, the user transfers a time chart recipe, into which setting values are inputted in advance, from an external instrument to a semiconductor manufacturing apparatus such as a die bonder via data communication, or the user installs a time chart recipe, into which setting values are inputted in advance, from an external storage device (for example, a magnetic tape, a magnetic disk such as a flexible disk or a hard disk, an optical disk such as a CD or a DVD, a magnetic optical disk such as an MO, or a semiconductor memory such as a USB memory or a memory card) in the semiconductor manufacturing apparatus. Furthermore, the main controller 81a can change the push-up operation of the push-up unit TU by rewriting the time chart recipe in real time on the basis of the state of the pick-up unit detected by the sensors 87a, 87b, 87c, and the like and giving instructions to the operation controller 81b.

As described above, by setting a time chart recipe, it is possible to arbitrarily set the operations of the blocks BL1 to BL4 respectively during the steps of the push-up operation of the push-up unit, so that the push-up unit TU can perform various operations. Examples of these operations will be explained below.

Figure 6:
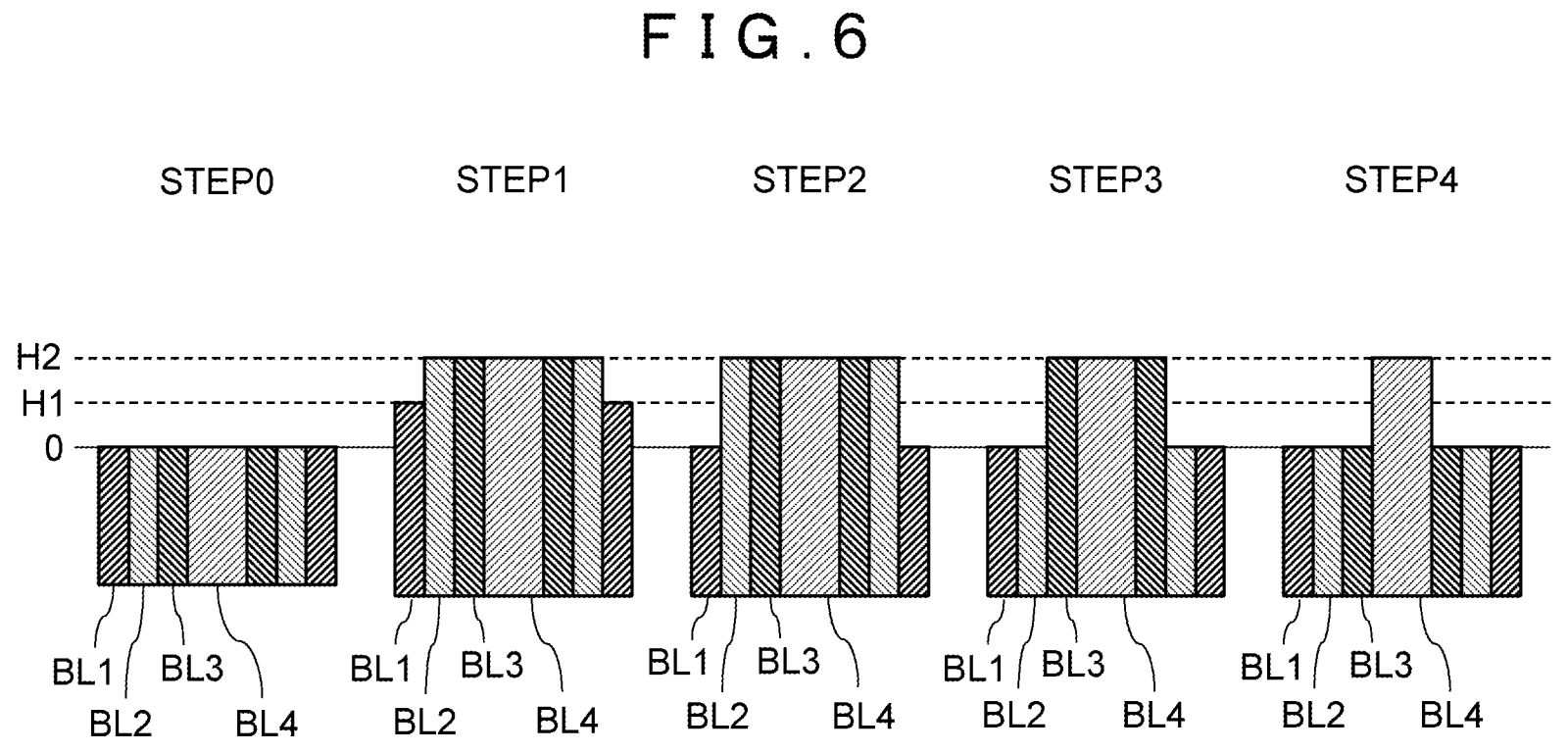

The operation of the RMS will be explained with reference to FIG. 6. FIG. 6 is a diagram used for explaining the push-up sequence of the RMS according to the embodiment.
(Zeroth Step: STEP0)

The pick-up operation is started at the time that a target die D on a dicing tape DT is positioned by the push-up unit TU and the collet CLT. After the positioning of the die D is finished, the control section CNT executes vacuumizing through the suction holes DPa of the push-up unit TU and gaps among the blocks BL1 to BL4, so that the dicing tape DT is sucked onto the upper surface of the push-up unit TU. At this time, the upper surfaces of the four blocks BL1 to BL4 are at the same height (initial position) as the upper surface of the dome plate DP. In that state, the control section CNT supplies vacuum from an unshown vacuum supply source, lowers the collet CLT toward the device face of the die D while executing vacuumizing, and lands the collet onto the device face of the die D.
(First Step: STEP1)

Subsequently, the control section CNT lifts the four blocks BL1 to BL4 at the same time at a predefined speed (s1). Here, the die D is lifted while being sandwiched between the collet CLT and the four blocks BL1 to BL4, but the periphery of the dicing tape DT remains sucked in vacuo onto the dome plate DP that composes the periphery of the push-up unit TU, so that a tension occurs in the periphery of the die D, so that the peeling-off of the dicing tape DT is started in the periphery of the die D. The control section CNT stops the outermost block BL1 from rising at the predefined height (H1) where the die begins to be peeled off from the dicing tape, and lifts the inside blocks BL2 to BL4 to a predefined height (H2) at a predefined speed (s1). Since the outermost block BL1 is stopped from lifting, a part of the support for the dicing tape DT disappears, so that the peeling-off of the dicing tape DT is advanced by the tension of the dicing tape DT. In this case, s1 is, for example, 5 mm/sec.
(Second Step: STEP2)

Subsequently, the control section CNT lowers the outermost block BL1 to a height that is the same height of the upper surface of the dome plate DP at a predefined speed (s2). In this case, s2 is, for example, 5 mm/sec. Here, it may be all right if the second block BL2 is lowered to the predefined height (H1) along with the lowering of the outermost block BL1.
(Third Step: STEP3)

Subsequently, the control section CNT lowers the second block BL2 to the height that is the same height of the upper surface of the dome plate DP at the predefined speed (s2). Since the second block BL2 is made to fall to the height that is the same height of the upper surface of the dome plate DP, another part of the support for the dicing tape DT disappears, so that the peeling-off of the dicing tape DT is further advanced by the tension of the dicing tape DT.
(Fourth Step: STEP4)

Subsequently, the control section CNT lowers the third block BL3 to the height that is the same height of the upper surface of the dome plate DP at the predefined speed (s2). Since the third block BL3 is made to fall to the height that is the same height of the upper surface of the dome plate DP, another part of the support for the dicing tape DT disappears, so that the peeling-off of the dicing tape DT is further advanced by the tension of the dicing tape DT.

Thereafter, the control section CNT pulls up the collet CLT, and lowers the fourth block BL4 at a constant speed (s3) so that the fourth block BL4 goes back to the initial position. Here, s3 is, for example, 5 mm/sec. With this, the operation of peeling off the die D from the dicing tape DT is finished.

The length (LO) of the overhang is set short, the uttermost block BL1 is stopped from lifting at the predefined height (H1), and the inner blocks BL2 to BL4 are lifted further to the predefined height (H2). With this, when the outermost block BL1 is made to function as the starting point of the peeling-off operation, a difference between the height of the block BL1 and the height of the blocks BL2 to BL4 does not become large when the blocks BL2 to BL4 are lifted, so that the deformations of the adjacent dice Dp and the deformation of the target die D to be peeled off can be reduced. As a result, stresses applied to the target die D to be peeled off and the adjacent dice Dp can be reduced, and it becomes possible to prevent the target die D and the adjacent dice from breaking up or cracking.

In addition, by setting the length (LO) of the overhang short, the outer periphery of the target die D to be peeled off can be peeled off from the dicing tape even if the push-up height is low. Furthermore, by making the height of the outermost block BL1 lower than the total push-up height of the blocks BL2 to BL4, the deformations of the adjacent dice Dp can be reduced. In addition, by setting the width (LO) of the overhang small, a distance from the edge of the outermost block BL1 to the edge of the target die to be peeled off becomes short, so that the target die to be peeled off is prevented from easily being deformed. Furthermore, by setting the total push-up height (H2) of the blocks BL2 to BL4 to be low, the operation time of the push-up unit TU becomes short, and the productivity of the die bonding apparatus is improved.

Modification Examples

Hereinafter, some of the representative modification examples of the embodiment will be illustrated. In the explanations of the following modification examples, it will be assumed that components that have the same configurations and functions as those of components described in the above embodiment are given the same reference signs as those given to the components described in the above embodiment. And it will be assumed that, in descriptions about such components, the descriptions about the corresponding components of the above embodiment are quoted accordingly as long as there is no technical contradiction. In addition, a part of the above embodiment and the entireties or parts of the plural modification examples can be adapted to one another accordingly and intricately as long as there is no technical contradiction.

First Modification Example

Figure 7:
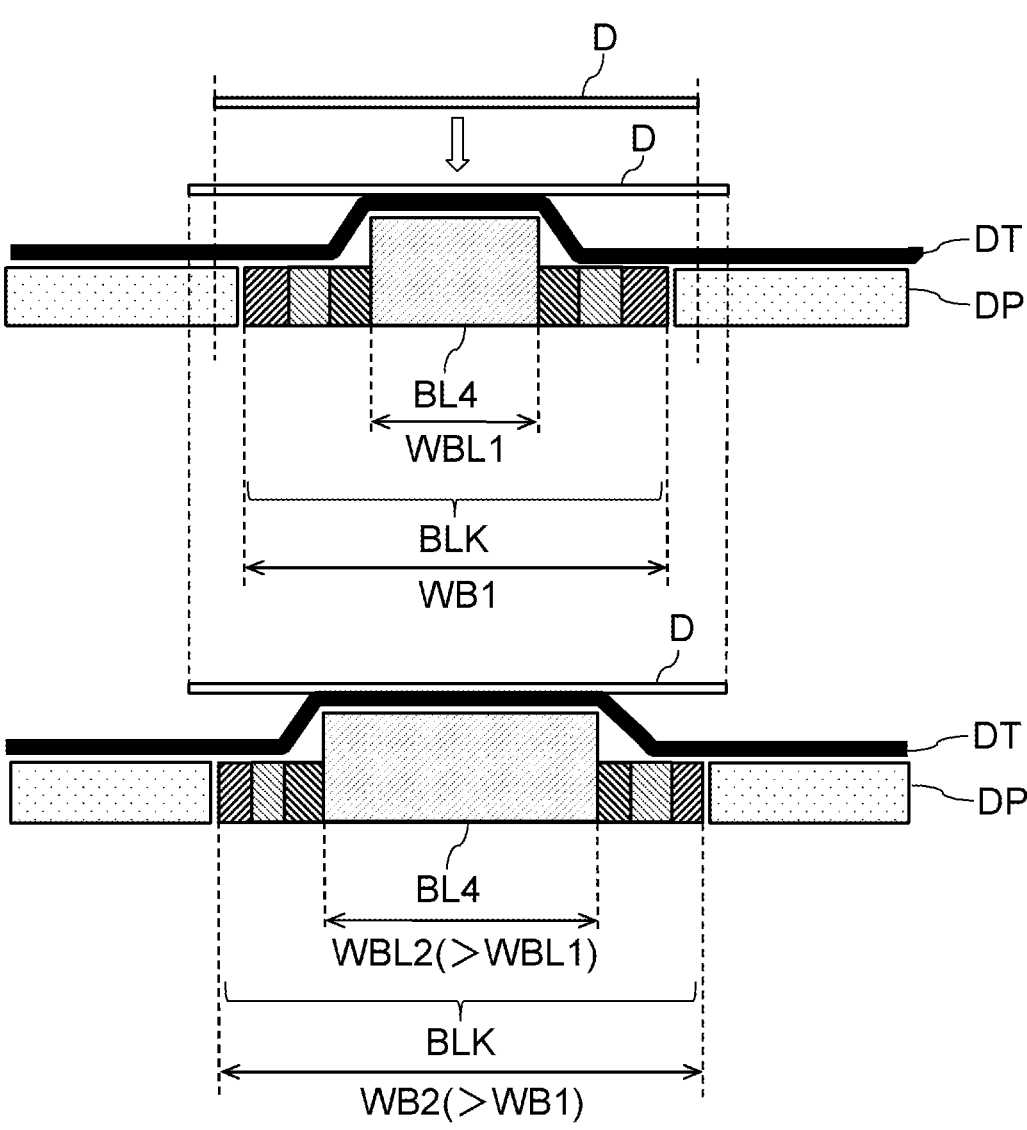
FIG. 7 is a diagram used for explaining a problem that occurs at the time of blocks being pushed up.

First, in order to clarify the present modification, a problem associated with the peeling-off of a die from a dicing tape will be explained by taking an RMS as an example with reference to FIG. 7. FIG. 7 is a diagram used for explaining a problem that occurs at the time of blocks being pushed up. The upper half of FIG. 7 is a sectional-view of a push-up unit TU showing a state where the height of blocks other than the innermost block is lowered when the total of the sizes of the blocks is not changed and the size of a die is made larger. The lower half of FIG. 7 is a sectional-view of a push-up unit TU showing a state where the height of blocks other than the innermost block is lowered when the total of the size of the blocks is made larger.

As shown in the upper half of FIG. 7, when the size of the die D becomes large and the size (WB1) of a block BLK (the entirety of the four blocks BL1 to BL4 of a push-up unit is collectively referred to as a block BLK) is not changed, the width of an overhang becomes large. As shown in the lower half of FIG. 7, in order to keep the size of hangover small, it is necessary to set the size (WB2) of the block BLK large depending on the size of the die D.

Therefore, if the number of the blocks of the push-up unit TU is constant and the target die to be peeled off becomes larger, the total of the widths of the four blocks BL1 to BL4, that is to say, a peeling-off area increases. However, in order for a collet CLT to stably hold the die D, it is necessary that a portion of the die D which is peeled off from the block BLK should reach the vacuum suction hole of the collet CLT and further in order to prevent the target die D to be peeled off from being deformed in the initial stage of the peeling-off step, the relevant peeling-off area needs to be as small as possible. As shown in the lower half of FIG. 7, in the case where the length of the overhang and the total of the block widths of the blocks BL1 to BL3 are kept short from the viewpoint of reducing a stress applied to the die during the push-up operation by the blocks, the block width (WBL2) of the innermost block BL4 becomes larger than the block width (WBL1) of the block BL4 shown in the upper half of FIG. 7. In other words, the peeling-off area increases. Since the adhesive force of a dicing tape DT that is applied to a target die to be peeled off during the peeling-off operation increases due to the increase of the peeling-off area, a stress applied to the die D increases, there is fear that a pick-up mistake or, in the worst case, the breakdown of the die occurs.

Figure 8:
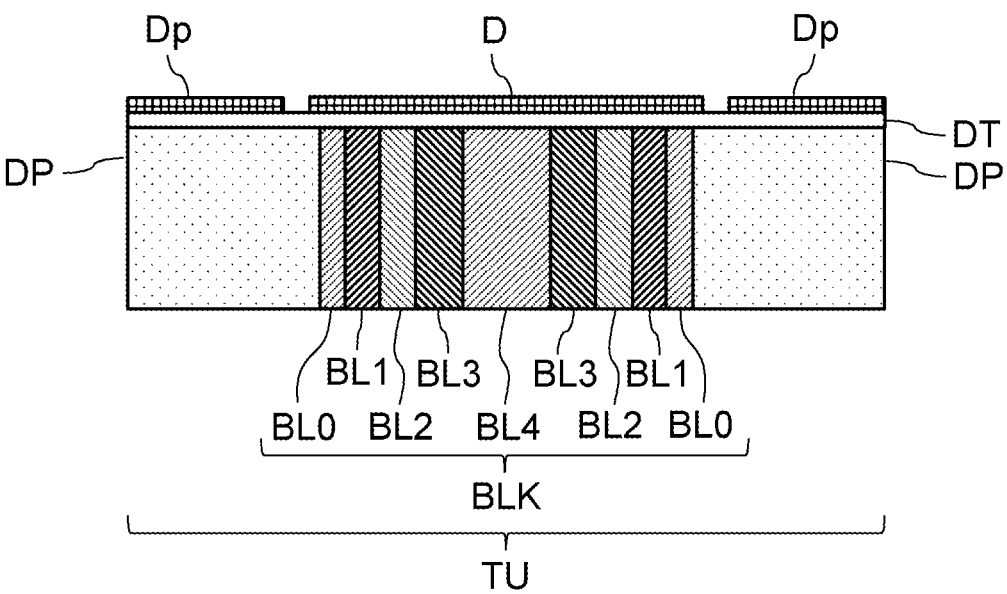
FIG. 8 is a cross-sectional view of the main part of a push-up unit according to a first modification example.
Figure 9:
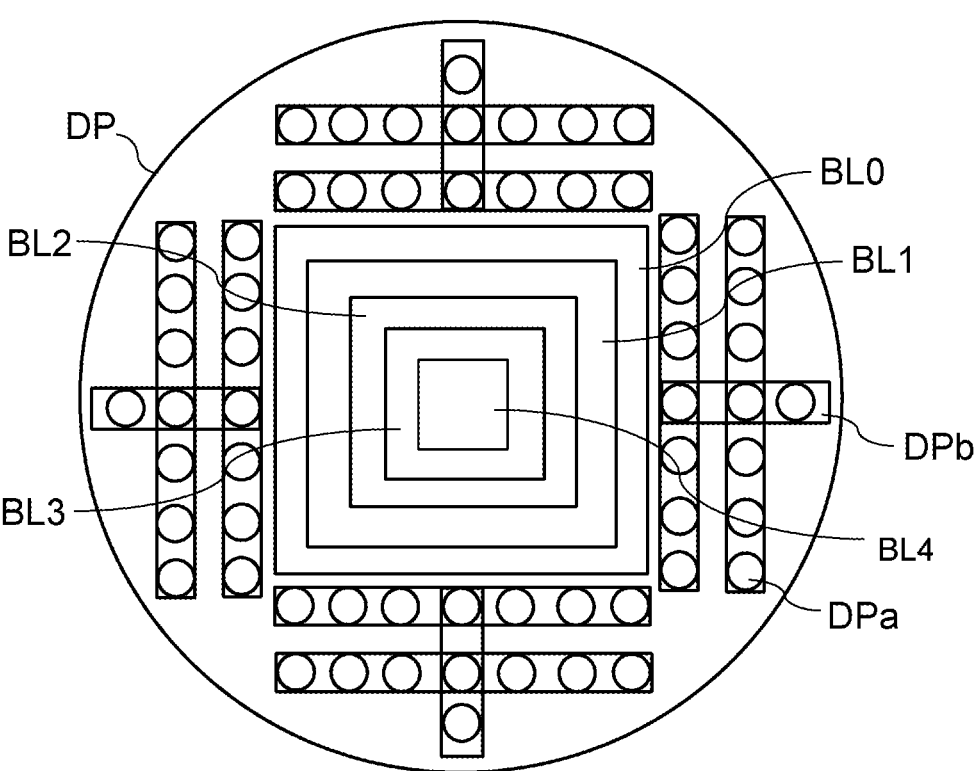
FIG. 9 is the top view of the push-up unit shown in FIG. 8.

Therefore, in the first modification example, the number of blocks of the push-up unit TU is set larger than the number of the push-up unit according to the embodiment. The push-up unit of the first modification example will be explained with reference to FIG. 8 and FIG. 9. FIG. 8 is a cross-sectional view of the main part of the push-up unit according to the first modification example, and shows a state where the push-up unit is in contact with the dicing tape. FIG. 9 is the top view of the push-up unit shown in FIG. 8.

Five blocks BL0 to BL4 for pushing up the dicing tape DT are embedded in the central part of the push-up unit TU. The first modification example has a configuration in such a way that a zeroth block BL0 the outer peripheral length of which is larger than that of the first block BL1 according to the embodiment is provided outside of the first block BL1. The zeroth block BL0 is in the shape of a square cylinder.

The outermost block BL0 the outer peripheral length of which is the largest of the outer peripheral lengths of the five blocks BL0 to BL4 is one size smaller than the outer peripheral length of the target die D to be peeled off.

The length (LO) of the overhang is the same as that of the pick-up unit according to the embodiment, and the block width of a position where the outermost block BL0 and the dicing tape DT have contact with each other is, for example, about 0.3 mm to 0.6 mm. The total of the block widths of the inner blocks BL1 to BL4 is the same as that according to the embodiment respectively. In this case, it is preferable that the area (peeling-off area) of the surface of the innermost block BL4 that have contact with the dicing tape DT is about 30% of the area of the die D.

The heights of the upper surfaces of the five blocks BL0 to BL4 are equal to one another at their initial states (at the time of the five blocks BL0 to BL4 not in operation), and the heights of the upper surfaces are equal to or lower than the height of the upper surface of a dome plate DP.

The five blocks BL0 to BL4 can be moved up and down independently by needles NDL5 to NDL1 that are the five drive axes of a drive section 86c. The drive section 86c includes a motor and a plunger mechanism that converts the rotations of the motor into up-and-down motions using a cam or a link, and gives up-and-down-motions to the needles NDL5 to NDL1.

Block push-up according to the first modification example will be explained with reference to FIG. 10A and FIG. 10B. FIG. 10A and FIG. 10B are diagrams used for explaining the block push-up according to the first modification example. FIG. 10A is a cross-sectional view showing a state where the blocks are in the middle of being pushed up, and FIG. 10B is a cross-sectional view showing a state where the push-up of the blocks is finished.

As shown in FIG. 10A, the total of the sizes of the blocks is made large, and an overhang is made short. Furthermore, when the five blocks BL0 to BL4 are pushed up, pushing up the outermost block BL0 is stopped at the time of the outer periphery of the die D being peeled off, and as shown in FIG. 10B, the inner blocks BL1 to BL4 are further pushed up, so that the deformations of adjacent dice Dp are prevented from occurring. The width (WO) of the overhang is, for example, 0.15 mm to 4.5 mm. In addition, a height (H1) at which the outermost block BL0 is stopped from rising is, for example, 0.075 mm to 0.12 mm. A height (H2) to which the inner blocks BL1 to BL4 are pushed up is the same as the height in the case of the embodiment and, for example, 0.15 mm to 0.2 mm.

The operation of an RMS according to the first modification example is similar to the operation of the RMS according to the embodiment. The zeroth block BL0, which is the outermost block, according to the first modification example performs an operation similar the operation performed by the first block BL1 that is the outermost block according to the embodiment. The blocks BL1 to BL4, which are inner blocks, according to the first modification example perform operations similar to the operations performed by the blocks BL2 to BL4 that are the inner blocks according to the embodiment.

Second Modification Example

Figure 12A:
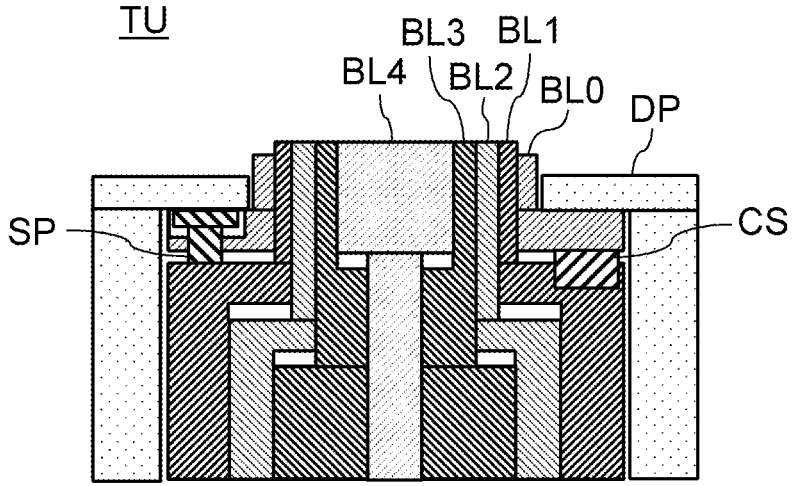
FIG. 12A and FIG. 12B are diagrams used for explaining the configuration and operation of the push-up unit according to the second modification example.
Figure 12B:
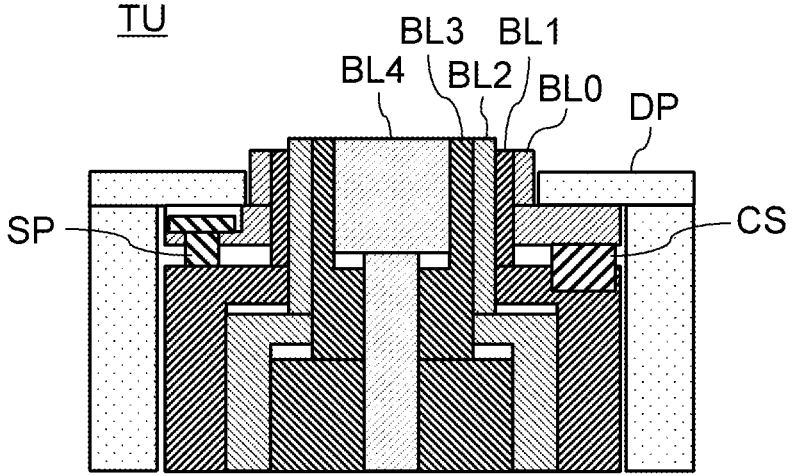

In the first modification example, the five blocks BL0 to BL4 of the push-up unit TU are made to perform push-up operations by the five needles NDL5 to NDL1 that are the drive axes respectively. Meanwhile, in a second modification example, the number of the drive axes (needles) of a push-up unit TU itself is not increased, but the number of pushed-up blocks is increased using the four-step push-up mechanism according to the embodiment. The configuration and operation of the push-up unit according to the second modification example will be explained with reference to FIG. 11A, FIG. 11B, FIG. 12A, FIG. 12B, FIG. 13A, and FIG. 13B. FIG. 11A is a cross-sectional view showing an initial state of the push-up unit according to the second modification example. FIG. 11B is a cross-sectional view showing a first state of the push-up unit according to the second modification example. FIG. 12A is a cross-sectional view showing a second state of the push-up unit according to the second modification example. FIG. 12B is a cross-sectional view showing a third state of the push-up unit according to the second modification example. FIG. 13A is a cross-sectional view showing a fourth state of the push-up unit according to the second modification example. FIG. 13B is a cross-sectional view showing a fifth state of the push-up unit according to the second modification example.

Five blocks BL0 to BL4 that push up a dicing tape are embedded in the central portion of the push-up unit TU. As for the disposition of the five blocks BL0 to BL4, the first block BL1, the outer peripheral length of which is smaller than that of the zeroth block BL0, is disposed inside of the zeroth block BL0 the outer peripheral length of which is the largest, the second block BL2, the outer peripheral length of which is smaller than that of the first block BL1, is disposed inside of the first block BL1, the third block BL3, the outer peripheral length of which is smaller than that of the second block BL2, is disposed inside of the second block BL2, and the fourth block BL4 the outer peripheral length of which is the smallest is disposed inside of the third block BL3. A compression coil spring CS and a hold pin SP connected to the first block BL1 are installed between the outermost zeroth block BL0 and the first block BL1. The inner blocks BL1 to BL4 are configured to move up and down in conjunction with needle pins NDL4 to NDL1 that are made to move up and down by an unshown drive mechanism respectively.

The outer peripheral lengths and widths of the five blocks BL0 and BL4 and the width of an overhang are the same as those according to the first modification example. The heights of the upper surfaces of the five blocks BL0 to BL4 are equal to one another at their initial states (at the time of the blocks BL0 to BL4 not in operation), and the heights of the upper surfaces are equal to the height of the upper surface of a dome plate DP. A distance between the outermost zeroth block BL0 and the first block BL1 is kept constant by the compression coil spring CS and the hold pin SP.

In order to push up the five blocks BL0 to BL4 at the same time, first the inner blocks BL1 to BL4, which are in conjunction with unshown needles NDL4 to NDL1 respectively, are pushed up by pushing up the needles NDL4 to NDL1. With this, as shown in FIG. 11B, the outermost block BL0 is pushed up by the spring force of the compression coil spring CS installed between the outermost block BL0 and the first block BL1, so that the five blocks BL0 and BL4 are pushed up at the same time. And the outermost block BL0 is stopped from lifting at a predefined height (H1) due to a part of the outermost block BL0 coming into contact with the dome plate DP (a first state). At this time, most of the area of a target die to be peeled off is supported by the upper surfaces of the five blocks BL0 to BL4, and the peeling-off of the die is effectively advanced at the boundary between the die D and the dicing tape DT in an area outside of the outer periphery (edge) of the upper surface of the outermost block BL0.

Here, the compression coil spring CS needs to have a spring force strong enough to at least hold up the outermost block BL0 against the tension of the dicing tape DT. If the spring force of the compression coil spring CS is weaker than the tension of the dicing tape DT, the outermost block BL0 cannot be held up by pushing up the needle NDL4, so that the die D cannot be supported by the upper surface of the outermost block BL0. In this case, since a sufficient stress cannot be applied concentratedly to a starting point for peeling off the die D from the dicing tape DT, there is a possibility that problems such as the reduction of the peeling-off speed, the crack of the die D due to an excessive bending stress applied to the die D, and the like occur.

Next, as shown in FIG. 12A, by pushing up the inner blocks BL1 to BL4 at the same time to a predefined height (H2), the dicing tape DT is pushed up (a second state). With this, the position of the outer periphery (edge) of the upper surface of the first block BL1 that supports the die D is shifted more inside in comparison with the previous state where the die D is supported by the outermost block BL0, so that the peeling-off of the die D from the dicing tape DT is advanced from an area outside of the outer periphery of the upper surface of the first block BL1 toward the center of the die D.

In order to push up the four blocks BL1 to BL4 at the same time, the inner blocks BL1 to BL4, which are in conjunction with unshown four needles NDL4 to NDL1 respectively, are further pushed up by pushing up the needles NDL4 to NDL1.

When the four blocks BL1 to BL4 are pushed up, in order to advance the peeling-off of the die D from the dicing tape DT, the dicing tape DT having contact with the die D is sucked down by decompressing the insides of gaps among the five blocks BL0 to BL4. In addition, the dicing tape DT having contact with the upper surface of the dome plate DP is brought into close contact with the upper surface of the dome plate DP by decompressing the insides of grooves DPb.

Next, as shown in FIG. 12B, the first block BL1 is pushed down to the lifting height (H0) of the outermost block BL0, so that the lower surface of the die D is supported by the upper surfaces of the inner blocks BL2 to BL4 (a third state). In order to push down the first block BL1, the needle ND4 is pushed down, so that the first block BL1 in conjunction with the needle NDL4 is pushed down. With this, the position of the outer periphery (edge) of the upper surface of the second block BL2 that supports the die D is shifted more inside in comparison with the previous state where the die D is supported by the first block BL1, so that the peeling-off of the die D from the dicing tape is advanced from an area outside of the outer periphery of the upper surface of the second block BL2 toward the center of the die D.

Next, as shown in FIG. 13A, the first block BL1 is pushed down to the height of the initial state (the upper surface of the dome plate DP), so that the outermost block BL0 is also pushed down to the height of the initial state (a fourth state).

Next, as shown in FIG. 13B, the second block BL2 is pushed down to the height of the initial state (the upper surface of the dome plate DP), so that the lower surface of the die D is supported by the upper surfaces of the inner blocks BL3 and BL4 (a fifth state). In order to push down the second block BL2, the needle ND3 is pushed down, so that the second block BL2 in conjunction with the needle NDL3 is pushed down. With this, the position of the outer periphery (edge) of the upper surface of the block BL3 that supports the die D is shifted more inside in comparison with the previous state where the die D is supported by the second block BL2, so that the peeling-off of the die D from the dicing tape is advanced from an area outside of the outer periphery of the upper surface of the third block BL3 toward the center of the die D.

The third block BL3 is pushed down to the height of the initial state (the upper surface of the dome plate DP) as is the case with the second block BL2.

Subsequently, the innermost block BL4 is pushed down, and at the same time, a collet is pushed up, so that the operation of peeling off the die D from the dicing tape DT is finished.

The area of the upper surface of the innermost block BL4 needs to be small enough for the collet CLT to be able to peel off the die D from the dicing tape DT using only the suction force of its own. If the area of the upper surface of the innermost block BL4 is large, a contact area between the die D and the dicing tape DT becomes large, and an adhesive force therebetween becomes strong, so that the collet cannot peel off the die D from the dicing tap DT using only a suction force applied to the die D by the collet.

In the second modification example, a zeroth block BL0 that is driven by a compression coil spring is added to the first block BL1 that is the outermost block of the multiaxial push-up unit according to the embodiment. By continuously operating the zeroth block BL0, which is the outermost block according to the second modification example, and the first block BL1 inside of the zeroth block BL0 in conjunction with each other in a hardware manner, it becomes possible to push up the zeroth block BL0 and the first block BL1 with a step therebetween. With this, the second modification example can be configured without adding a new drive axis. Furthermore, it becomes easy to make the setting of the overhang and the setting of conditions.

Third Modification Example

Figure 14A:
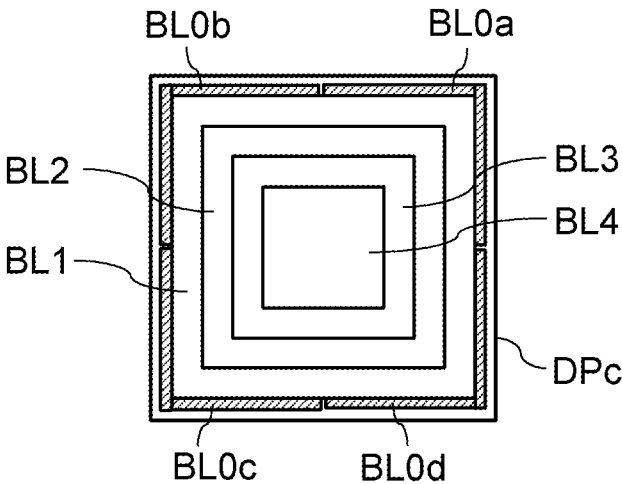
FIG. 14A and FIG. 14B are the top views of the main part of a push-up unit according to a third modification example.
Figure 14B:
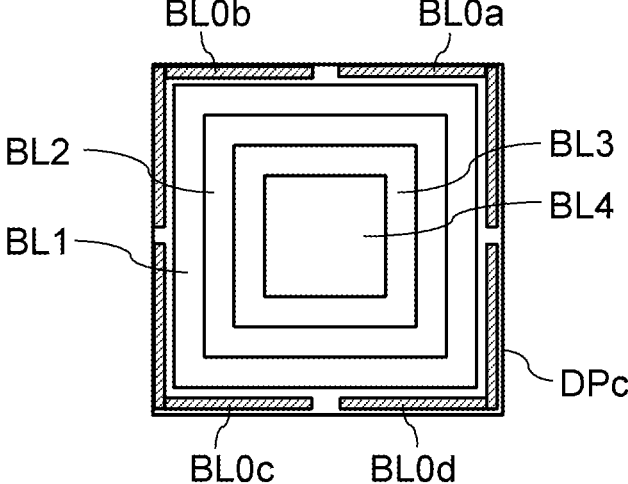

In the first modification example, the position of the block BL0 is fixed to the outermost periphery. Meanwhile, in a third modification example, the outermost block is divided into plural blocks, and these blocks are configured in such a way that the positions of these blocks can be adjusted. A push-up unit according to the third modification example will be explained with reference to FIG. 14A and FIG. 14B. FIG. 14A and FIG. 14B are the top views of the main part of the push-up unit according to the third modification example. FIG. 14A is a diagram showing that the outermost block is disposed on the innermost side. FIG. 14B is a diagram showing that the outermost block is disposed on the outermost side.

The outermost block BL0 is composed of four L-shaped blocks BL0a to BL0b in a plane view. A distance between a first block BL1 and the edge DPc of a hole of a dome plate DP is set larger than the sum of the width of the outermost block BL0 and a gap between two blocks, and the four blocks BL0a to BL0b are configured in such a way that the positions of these blocks are adjustable respectively. With this, the amount of the overhang can be set optimal using the same hardware.

Here, in FIG. 14A, a distance between the outer peripheries of the outermost blocks BL0a to BL0b and the edge DPc of the hole of the dome plate DP is larger than a normal gap, that is to say, the largest. A distance between the inner peripheries of the outermost blocks BL0a to BL0b and the outer periphery of the first block BL1 is the normal gap. A distance between the outer peripheries of the outermost blocks BL0a to BL0b and the edge DPc of the hole of the dome plate DP are the normal gap. A distance between the inner peripheries of the outermost blocks BL0a to BL0b and the outer periphery of the first block BL1 is larger than the normal gap, that is to say, the largest.

Fourth Modification Example

Figure 15A:
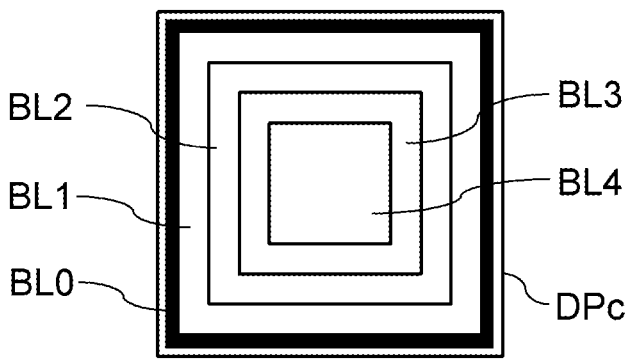
FIG. 15A and FIG. 15B are the top views of the main part of a push-up unit according to a fourth modification example.
Figure 15B:
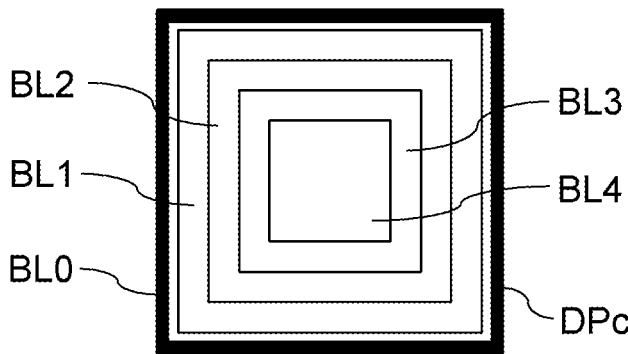

In a fourth modification example, the contact portion of an outermost block with a dicing tape DT is set exchangeable. A push-up unit according to the fourth embodiment will be explained with reference to FIG. 15A and FIG. 15B. FIG. 15A and FIG. 15B are the top views of the main part of the push-up unit according to the fourth modification example. FIG. 15A is a diagram showing the outermost block is disposed on the innermost side. FIG. 15B is a diagram showing the outermost block is disposed on the outermost side.

Plural blocks having different sizes (outer peripheral length) are prepared in advance as the outermost block BL0, and by providing a mounting section compatible with a finally-selected block BL0 to be mounted between the first block BL1 and the edge DPc of the hole of the dome plate DP, the outermost block BL0 is set exchangeable. With this, only exchanging a part of a block BLK (the entirety of the five blocks BL0 to BL4 of the push-up unit is collectively referred to as a block BLK) makes it possible to set an overhang amount optimal.

In addition, in FIG. 15A, a distance between the outer periphery of the outermost block BL0 and the end DPc of the hole of the dome plate DP is larger than the normal gap, that is to say, the greatest. A distance between the inner periphery of the outermost block BL0 and the outer periphery of the first block BL1 is the normal gap. In FIG. 15B, a distance between the outer periphery of the outermost block BL0 and the edge DPc of the hole of the dome plate DP is the normal gap. A distance between the inner periphery of the outermost block BL0 and the outer periphery of the first block BL1 is larger than the normal gap and the greatest.

Practical Example

Figure 16:
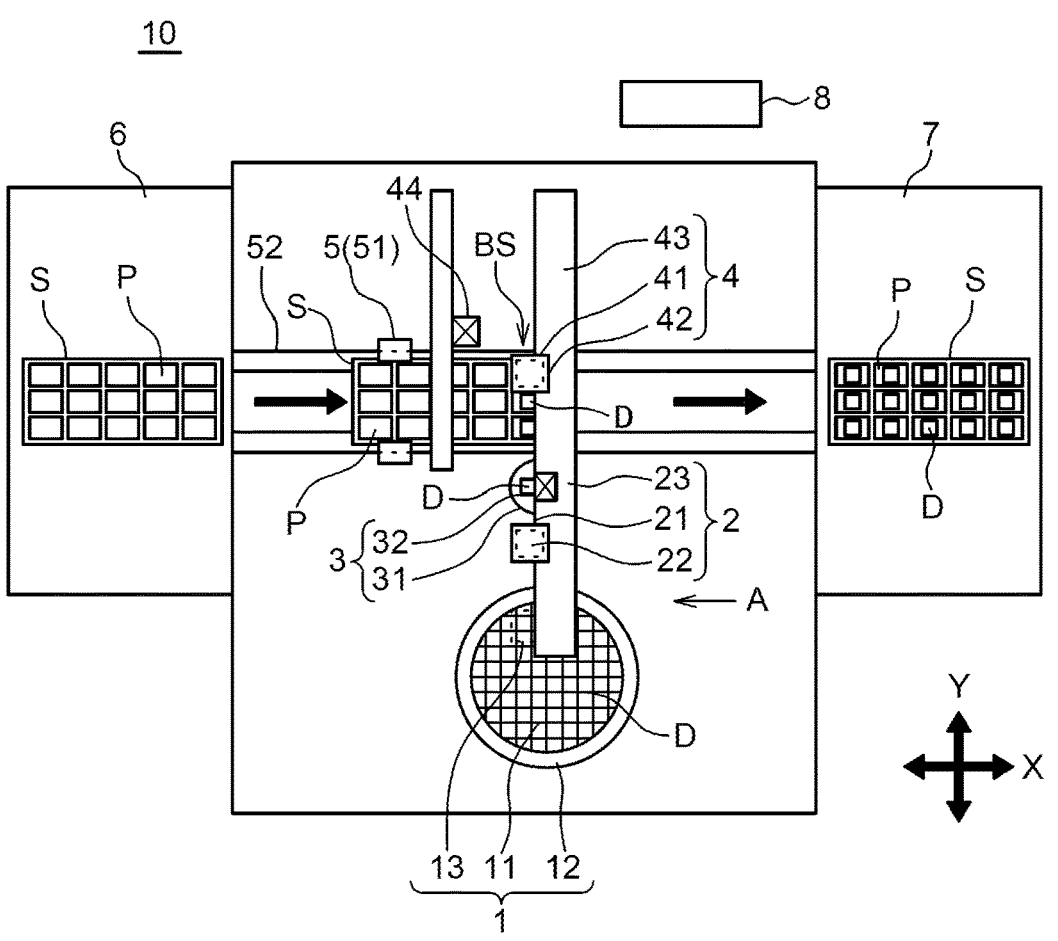
FIG. 16 is the conceptual diagram of a die bonder according to a practical example viewed from above.
Figure 17:
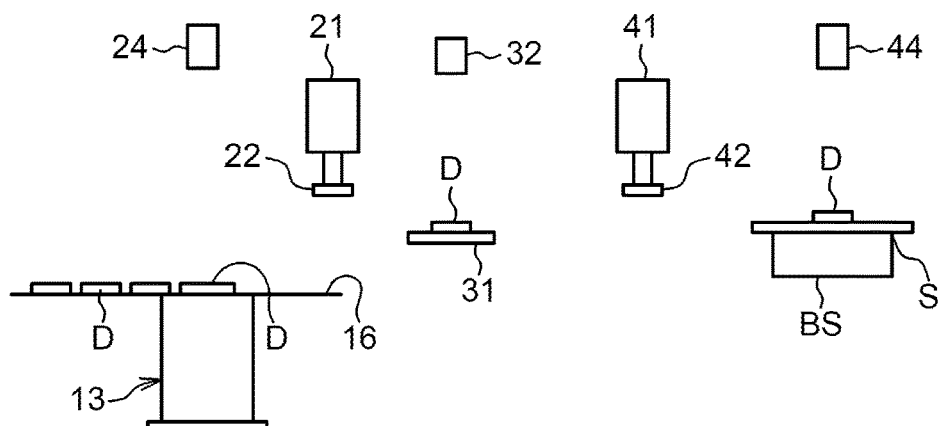
FIG. 17 is a diagram used for explaining the operations of a pick-up head and a bonding head viewed from an arrow A in FIG. 16.

FIG. 16 is the conceptual diagram of a die bonder according to a practical example viewed from above. FIG. 17 is a diagram used for explaining the operations of a pick-up head and a bonding head viewed from an arrow A in FIG. 16.

Schematically speaking, a die bonder 10, which is an example of a die bonding apparatus, includes: a die feed section 1 that feeds a die D to be mounted onto a substrate S; a pick-up section 2; an intermediate stage section 3; a bonding section 4; a transfer section 5; a substrate feed section 6; a substrate carrying-out section 7; and a control section 8 for monitoring and controlling the operations of the respective sections. The Y axis direction is a direction along which the die bonder 10 moves back and forth, and the X axis direction is a direction along which the die bonder 10 moves left and right. The die feed section 1 is disposed on the front portion of the die bonder 10 and the bonding section 4 is disposed on the rear portion. Here, one or more product areas (hereinafter, referred to as package areas P), each of which finally becomes a package, are printed on the substrate S.

First, the die feed section 1 feeds a die D to be mounted onto a package area P of the substrate S. The die feed section 1 includes: a wafer holder 12 for holding a wafer 11; and a push-up unit 13 that pushes up a die D from the wafer 11 and is shown in dashed lines. After being moved in the X or Y axis directions by unshown drive means, the die feed section 1 moves a die D to be picked up to the position of the push-up unit 13.

The pick-up section 2 includes: a pick-up head 21 for picking up a die D; a Y drive section 23 for moving the pick-up head 21 in the Y axis direction; and unshown plural drive sections for moving a collet 22 up and down, rotating the collet 22, and moving the collet 22 in the X axis direction respectively. The pick-up head 21 includes the collet 22 (also see FIG. 17) for sucking and holding a pushed-up die D at its tip, and picks up the die D from the die feed section 1 to mount the die D onto an intermediate stage 31. The pick-up head 21 includes unshown plural drive sections for moving the collet 22 up and down, rotating the collet 22, and moving the collet 22 in the X axis direction respectively.

The intermediate stage section 3 includes: the intermediate stage 31 for temporally mounting a die D; and a stage recognition camera 32 for recognizing the die D on the intermediate stage 31.

The bonding section 4 picks up the die D from the intermediate stage 31, and bonds the die D onto a package area P of a transferred substrate S or bonds the die D onto a die already-bonded on the package area P of the substrate S in such a manner that these dice are laminated. The bonding section 4 includes: a bonding head 41 having a collet 42 (also see FIG. 17) for sucking and holding a die D at its tip as is the case with the pick-up head 21; a Y drive section 43 for moving the bonding head 41 in the Y axis direction; and a substrate recognition camera 44 for photographing the position recognition mark (not shown) of a package area P of the substrate S to recognize a bonding position in the package area P.

With such a configuration, the bonding head 41 corrects the pick-up position/posture on the basis of the photographed data of the stage recognition camera 32, picks up a die D from the intermediate stage 31, and bonds the die D on a substrate S on the basis of the photographed data of the substrate recognition camera 44.

The transfer section 5 includes: substrate transfer claws 51 used for clawing and transferring a substrate S; and a transfer lane 52 along which the substrate S is transferred. The substrate S is transferred by driving unshown nuts of the substrate transfer claws 51 fixed to the transfer lane 52 using unshown ball screws fixed along the transfer lane 52.

With the use of such a configuration, the substrate S is moved from the substrate feed section 6 to the relevant bonding position along the transfer lane 52, and after the die D is bonded, the substrate S is moved to the substrate carrying-out section 7, and is passed to the substrate carrying-out section 7.

The control section (control device) 8 includes: memories for storing programs (software) for monitoring and controlling the operations of the respective sections of the die bonder 10; and a central processor unit (CPU) for executing the programs stored in the memories.

Next, the configuration of the die feed section 1 will be explained with reference to FIG. 18. FIG. 18 is a schematic cross-sectional view showing the main part of the die feed section shown in FIG. 16.

The die feed section 1 includes: the wafer holder 12 that moves in the horizontal direction (the X axis or Y axis direction); and the push-up unit 13 that moves up and down. The wafer holder 12 includes: an expand ring 15 that holds a wafer ring 14; and a support ring 17 that horizontally positions a dicing tape 16 that is held by the wafer ring 14 and to which plural dice D are bonded. The push-up unit 13 is disposed inside of the support ring 17.

When the die feed section 1 pushes up a die D, the die feed section 1 lowers the expand ring 15 that holds the wafer ring 14. As a result, the dicing tape 16 held by the wafer ring 14 is stretched, spaces among dice D are expanded, and the die D is pushed up from under the die D itself by the push-up unit 13, which improves the die D picked-up performance. To note, a bonding agent for bonding a die to a substrate has changed from a liquid agent to a film agent, and a film-shaped bonding material called a die attach film (DAF) 18 is attached to the wafer 11 and the dicing tape 16 in such a way that the film-shaped bonding material is sandwiched in between the wafer 11 and the dicing tape 16. If a wafer 11 includes a die attach film 18, dicing is performed on both wafer 11 and die attach films 18. Therefore, in the peeling-off step, the wafer 11 and the die attach film 18 are peeled off from the dicing tape 16. To note, hereinafter, the peeling-off step will be explained ignoring the presence of the die attach film 18.

Next, a manufacturing method of a semiconductor device using the die bonder according to the practical example will be explained with reference to FIG. 19. FIG. 19 is a flowchart showing the manufacturing method of a semiconductor device using the die bonder shown in FIG. 16.
(Step S11: Wafer/Substrate Carrying-In Step)

The wafer ring 14 that holds a dicing tape 16 to which a die D separated from the wafer 11 is attached is stored in a wafer cassette (not shown), and the cassette is carried in the die bonder 10. The control section 8 feeds a wafer ring 14 from the wafer cassette filled up with wafer rings 14 to a die feed section 1. Furthermore, the control section 8 prepares a substrate S and carry the substrate S in the die bonder 10. The control section 8 fixes the substrate S to substrate transfer craws 51 at the substrate feed section 6.

(Step S12: Pick-Up Step)

As mentioned above, the control section 8 peels off the die D, and picks up the peeled-off die D from the wafer 11. The die D as well as the die attach film 18 that is peeled off from the dicing tape 16 is sucked and held by a collet 22, and transferred to the next step (Step S13). And, when the collet 22 that has transferred the die D to the next step goes back to the die feed section 1, the next die is peeled off from the dicing tape 16 according to the abovementioned sequence, and subsequently, according to a similar sequence, dice D are peeled off from the dicing tape 16 one by one.

(Step S13: Bonding Step)

The control section 8 mounts the picked-up die onto the substrate S, or on an already-bonded die in such a manner that these dice are laminated. After mounting the die picked-up from the wafer 11 onto an intermediate stage 31, the control section 8 picks up the die again from the intermediate stage 31 and bonds the die onto the transferred substrate S using a bonding head 41.

(Step S14: Substrate Carrying-Out Step)

The control section 8 brings out the substrate S to which the die is bonding from the substrate transfer craws 51 at the substrate carrying-out section 7, and carries out the substrate S from the die bonder 10.

As described above, the dice D are mounted onto the substrate S via the die attach film 18, and are carried out from the die bonder. And then the dice D are electrically connected to the electrodes of the substrate S via Au wires in a wire bonding step. Subsequently, the substrate S onto which dice D are mounted is carried in the die bonder, and second dice D are laminated on the dice D mounted onto the substrate S via the die attach film 18, and after the substrate S on which the dice D and the second dice D are laminated is carried out from the die bonder, the dice D and the second dice D are electrically connected to the electrodes of the substrate S via Au wires respectively in the wire bonding step. After being peeled off from dicing tape 16 in the abovementioned way, the second dice D are transferred to a pellet bonding step, and are laminated on the already-bonded dice D respectively. After the above steps are repeated predefined times, the substrate S is transferred to a mold step, and the plural dice D and the Au wires are sealed by mold resin (not shown), so that laminated packages are completed.

As described above, in the case of assembling a laminated package in which plural dice are three-dimensionally mounted onto a substrate, it is required that the thickness of a die should be 0.02 mm or less in order to prevent the thickness of the package from increasing. On the other hand, since the thickness of a dicing tape is about 0.1 mm, the thickness of the dicing tape becomes four to five times the thickness of a die.

When such a thin die is tried to peel off from the dicing tape, the deformation of the die prominently occurs in association with the deformation of the dicing tape. On the other hand, in the die bonder according to the present embodiment, the damage of a die that will occur when the die is picked up from a dicing tape can be reduced.

In the above descriptions, although the disclosure achieved by the disclosers has been explained concretely on the basis of the embodiment, the modification examples, and the practical example, the present disclosure is not limited to the above-described embodiment, the modification examples, and the practical example, and it goes without saying that various kinds of alternations can be made.

For example, although the explanations have been made under the assumption that the number of the blocks in the embodiment is four, and the number of the blocks in the modification examples is five, it is conceivable that the number of blocks is six or more depending on the size of a die.

In addition, although the descriptions of the plural blocks of each of the push-up units have been made assuming that the plural blocks are in the shape of concentric quadrangles, the plural blocks can be in the shape of concentric circles or concentric ellipses, or the plural blocks can be composed of plural concentric quadrangles disposed in parallel with one another.

Furthermore, in the practical example, although the die bonder in which a die attach film is used has been explained, a preform section that applies an adhesive agent to a substrate may be prepared, making it unnecessary to use the die attach film.

In addition, in the practical example, although the die bonder, in which a pick-up head picks up a die from a die feed section, and mounts the die onto an intermediate stage, and a bonding head bonds the die mounted onto the intermediate stage to a substrate, has been explained, the practical example can be applied not only to a die bonder having the above scheme but also to a die bonding apparatus having a scheme in which a die is picked up from a die feed section.

For example, the practical example can be applied to a die bonder that does not have an intermediate stage and a pick-up head and has a scheme in which a die stored in a die feed section is bonded to a substrate by a bonding head.

Furthermore, the practical example can be applied to a flip chip bonder having no intermediate stage in which a die is picked up from a die feed section, passed to a bonding head by rotating a pick-up head upward, and bonded to a substrate by the bonding head.

What is claimed is:

1. A manufacturing method for a semiconductor apparatus comprising:

a carrying-in step for carrying in a wafer ring for holding a dicing tape to a die bonding apparatus including a push-up unit that includes plural blocks having contact with the dicing tape, a dome plate, which is installed outside of the plural blocks and to which the dicing tape can be sucked, and that pushes up a die from under the dicing tape using the plural blocks, and a head that includes a collet, which sucks the die, and that can move up and down; and a pick-up step for pushing up the die using the push-up unit and picking up the die using the collet, wherein the pick-up step includes the steps of:

sucking the dicing tape using the dome plate;

landing the collet onto the die using the head;

sucking the die using the collet;

lifting the plural blocks from the dome plate at a same time from an initial position;

after the plural blocks are lifted to a first height where the die is peeled off from the dicing tape, stopping the lifting of an outermost block disposed on an outermost side among the plural blocks, and whose entire outer circumference is equidistantly adjacent to the dome plate;

after stopping the lifting of the outermost block, continue lifting blocks other than the outermost block among the plural blocks from the first height to a second height that is higher than the first height;

subsequently stopping the blocks other than the outermost block among the plural blocks from lifting at the second height;

after stopping the blocks other than the outermost block at the second height, lowering the outermost block from the first height to the original position;

after lowering the outermost block from the first height to the original position, lowering an adjacent block that is adjacent to the inside of the outermost block from the second height to the original position;

after lowering the adjacent block from the second height to the original position, lowering a block that is adjacent to the outside of the innermost block disposed on the innermost side among the plural blocks from the second height to the original position, and after lowering the block that is adjacent to the outside of the innermost block from the second height to the original position, lifting the collet using the head.

2. The manufacturing method for a semiconductor apparatus according to claim 1, further comprising a bonding step for bonding the die on a substrate or on an already bonded die.

3. The manufacturing method for a semiconductor apparatus according to claim 2, wherein the pick-up step further includes a step for mounting the picked-up die onto an intermediate stage, and the bonding step further includes a step for picking up the die from the intermediate stage.

4. The manufacturing method for a semiconductor apparatus according to claim 1, wherein the pick-up step further includes a step for lowering the innermost block from the second height.

* * * * *